(12) United States Patent
Tang et al.

(10) Patent No.: US 8,115,253 B2
(45) Date of Patent: Feb. 14, 2012

(54) ULTRA HIGH VOLTAGE MOS TRANSISTOR DEVICE

(75) Inventors: Sung-Nien Tang, Hsinchu County (TW); Sheng-Hsiong Yang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 175 days.

(21) Appl. No.: 12/556,576

(22) Filed: Sep. 10, 2009

(65) Prior Publication Data
US 2011/0057263 A1    Mar. 10, 2011

(51) Int. Cl.
*H01L 29/78* (2006.01)
*H01L 29/76* (2006.01)

(52) U.S. Cl. ........ 257/341; 257/339; 257/409; 257/288; 257/401

(58) Field of Classification Search ............. 257/339, 257/341, 401, 409
See application file for complete search history.

(56) References Cited

U.S. PATENT DOCUMENTS

| | | | |
|---|---|---|---|
| 5,430,316 A * | 7/1995 | Contiero et al. | 257/335 |
| 6,323,539 B1 * | 11/2001 | Fujihira et al. | 257/630 |
| 6,724,040 B2 * | 4/2004 | Fujihira | 257/328 |
| 6,894,349 B2 | 5/2005 | Beasom | |
| 7,049,669 B2 * | 5/2006 | Ma et al. | 257/401 |
| 7,148,540 B2 * | 12/2006 | Shibib et al. | 257/336 |
| 7,368,785 B2 * | 5/2008 | Chen et al. | 257/341 |
| 7,741,662 B2 * | 6/2010 | Kao | 257/288 |

OTHER PUBLICATIONS

H. Teranishi et al., "A High Density, Low On-resistance 700V Class Trench Offset Drain LDMOSFET (TOD-LDMOS)", 2003, p. 31.6.1-31.6.4, IEEE.

* cited by examiner

*Primary Examiner* — Jerome Jackson, Jr.
*Assistant Examiner* — David Spalla
(74) *Attorney, Agent, or Firm* — Winston Hsu; Scott Margo

(57) ABSTRACT

An ultra high voltage MOS transistor device includes a substrate having a first conductive type, a first well having a second conductive type and a second well having the first conductive type formed in the substrate, a drain region having the second conductive type formed in the first well, a source region having the second conductive type formed in the second well, a first doped region having the first conductive type formed between the second well and the substrate, an insulating layer formed in a first recess in the first well, a gate formed on the substrate between the source region and the first well, and a recessed channel region formed in the substrate underneath the gate.

13 Claims, 4 Drawing Sheets

ULTRA HIGH VOLTAGE MOS TRANSISTOR DEVICE

BACKGROUND OF THE INVENTION

1. Field of the Invention

The present invention relates to an ultra high voltage MOS transistor device, and more particularly, to an ultra high voltage lateral double-diffused metal-oxide-semiconductor (LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are widely used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore LDMOS transistor device can have higher breakdown voltage.

Please refer to FIG. 1, which is a cross-section view of a conventional LDMOS transistor device. As shown in FIG. 1, the conventional LDMOS transistor device 10 having a P-type well 20, a source 14 and a P-type heavily doped region 22 formed in the P-type well 20, a gate 16 and a drain 18 is formed on a semiconductor substrate 12. The drain 18 is an N-type heavily doped region formed in an N-type well 30, which is the drift region as mentioned above. The dope concentration and length of the drift region affects the breakdown voltage and the ON-resistance ($R_{ON}$) of LDMOS transistor device 10. The conventional LDMOS transistor device 10 further includes a P-type doped region 32 formed in the N-type well 30 for increasing the breakdown voltage of LDMOS transistor device 10. The gate 16 of LDMOS transistor device 10 is positioned on a gate dielectric layer 40 and extended to cover a portion of a field oxide layer 42.

Please still refer to FIG. 1. It is well-known that LDMOS transistor device 10 is used under high operational voltage environment, when the inductive voltage generated in the semiconductor substrate 12 during the operation is sufficiently large, a forward bias is generated between the semiconductor substrate 12 and the source 14, and a parasite bipolar junction transistor (BJT) is turned on. Thus the snap back voltage of the drain 18 is decreased and current flow from the drain 18 to the source 14 is abruptly increased. This so-called snap-back phenomenon makes LDMOS transistor device 10 defective.

Secondly, the P-type doped region 32 formed in the N-type well 30 is to form a fully-depleted region in the drift region, and the fully-depleted region has to be formed before the device reaches the breakdown voltage. Conventionally, the prior art reduces the dope concentration of the N-type well 30 for accelerating the formation of the fully-deleted region. However, this method suffers higher $R_{ON}$ due to the low dope concentration of the N-type well 30.

Therefore, a LDMOS transistor device that is able to realize high breakdown voltage and low $R_{ON}$, and to avoid the abovementioned problem is still in need.

SUMMARY OF THE INVENTION

It is therefore a primary objective of the present invention to provide a LDMOS transistor device that is able to avoid parasite BJT effect and potential lines with larger curvature occurred in the channel region under high operational voltage environment.

According to the claimed invention, an ultra high voltage MOS transistor device is provided. The ultra high voltage MOS transistor device comprises a substrate having a first conductive type; a first well having a second conductive type formed in the substrate; a drain region having the second conductive type formed in the first well; a source region having the second conductive type formed in the substrate; an insulating layer formed on a surface of the first well; a gate positioned on the substrate between the source region and the first well; and a recessed channel region formed in the substrate under the gate.

According to the claimed invention, another ultra high voltage MOS transistor device is provided. The ultra high voltage MOS transistor device comprises a substrate having a first conductive type; an epitaxial layer having a second conductive type formed on the substrate; a first well having the second conductive type formed in the epitaxial layer; a drain region having the second conductive type formed in the first well; a second well having the first conductive type formed in the epitaxial layer; a source region having the second conductive type formed in the second well; a first doped region having the first conductive type formed in a bottom of the second well; and a gate positioned on the substrate between the source region and the first well.

According to the claimed invention, stilled another ultra high voltage MOS transistor device is provided. The ultra high voltage MOS transistor device comprises a substrate having a first conductive type; a first well having a second conductive type formed in the substrate; a drain region having the second conductive type formed in the first well; a source region having the second conductive type formed in the substrate; a first recess formed in the substrate in the first well, the first recess comprising a depth of 1-4 micrometer (µm); and an insulating layer formed in the first recess.

According to the ultra high voltage MOS transistor device provided by the present invention, the recessed channel region is provided to alleviate the large curvature problem of the potential lines occurred at the channel region, the first doped region is provided to prevent the parasite BJT effect from being occurred between the second well and the substrate, and the first recess with larger depth in the first well is provided to improve the formation of the fully-depleted region, therefore the breakdown voltage of LDMOS transistor device is increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
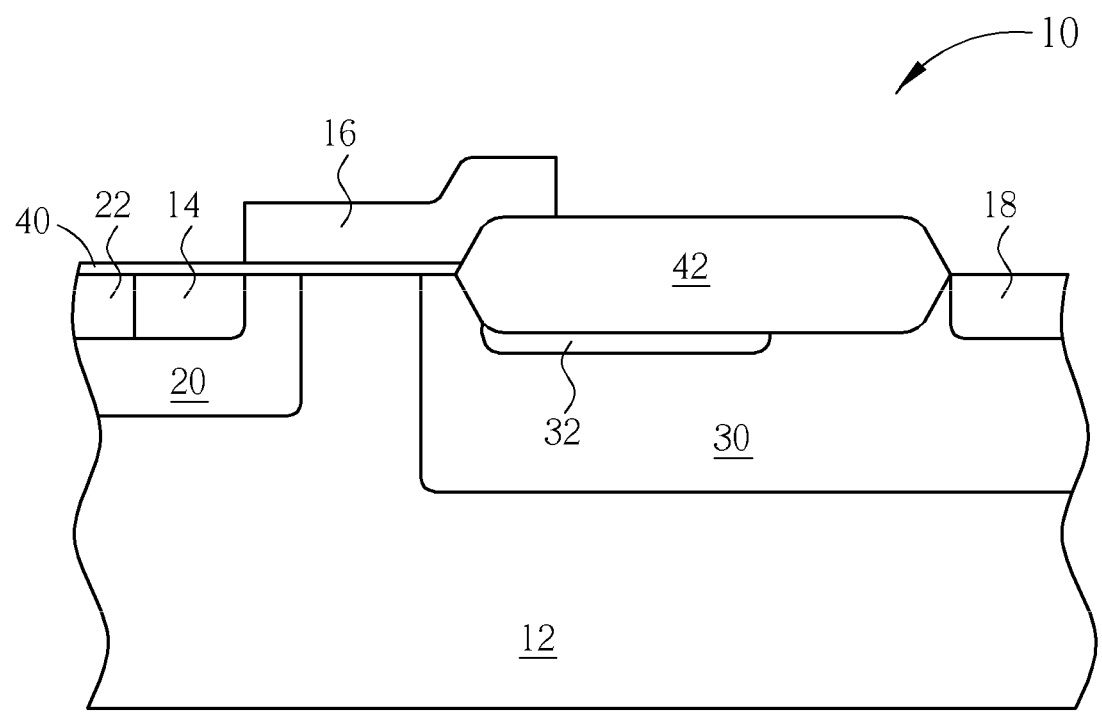
FIG. 1 is a cross section view of a conventional LDMOS transistor device.
Figure 2:
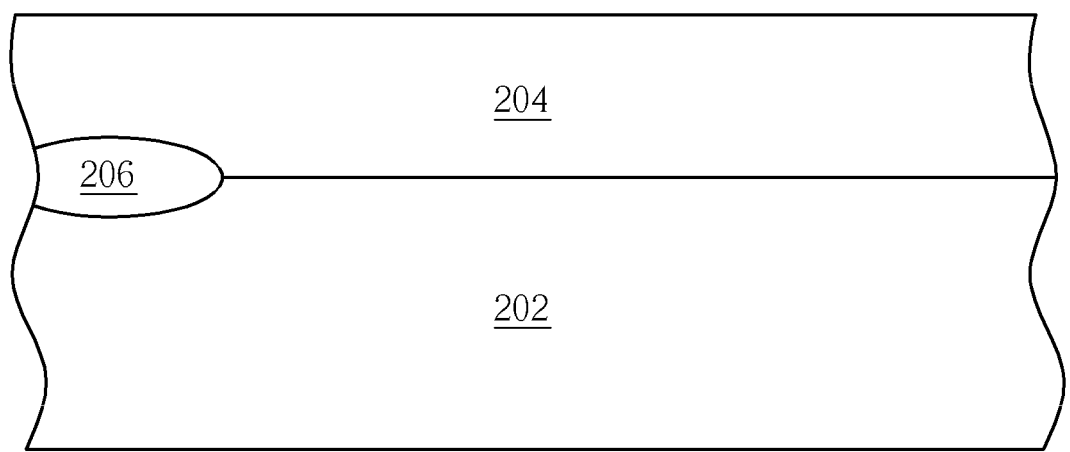
FIGS. 2-8 are cross sectional view illustrating formation of an ultra high voltage MOS transistor device provided by a preferred embodiment of the present invention.

Please refer to FIGS. 2-8, which are cross-sectional view illustrating formation of an ultra high voltage MOS transistor device provided by a preferred embodiment of the present invention. In this preferred embodiment, the first conductive type is P-type and the second conductive type is N-type. However, it is well-known to those skilled in the art that the first conductive type and the second conductive type can respectively be N-type and P-type. As shown in FIG. 2, the ultra high voltage MOS transistor device provided by the present invention is fabricated on a semiconductor substrate having the first conductive type, such as a P-type substrate 202, and is electrically isolated from other devices by at least a field oxide layer or a shallow trench isolation (STI) (not shown). Next, P-type dopants are implanted into the P-type substrate 202 by an ion implantation and followed by forming an epitaxial layer having the second conductive type, such as an N-type epitaxial layer 204, on the P-type substrate 202. Accordingly, a P-type heavily doped region 206 is formed between the P-type substrate 202 and the N-type epitaxial layer 204.

Figure 3:
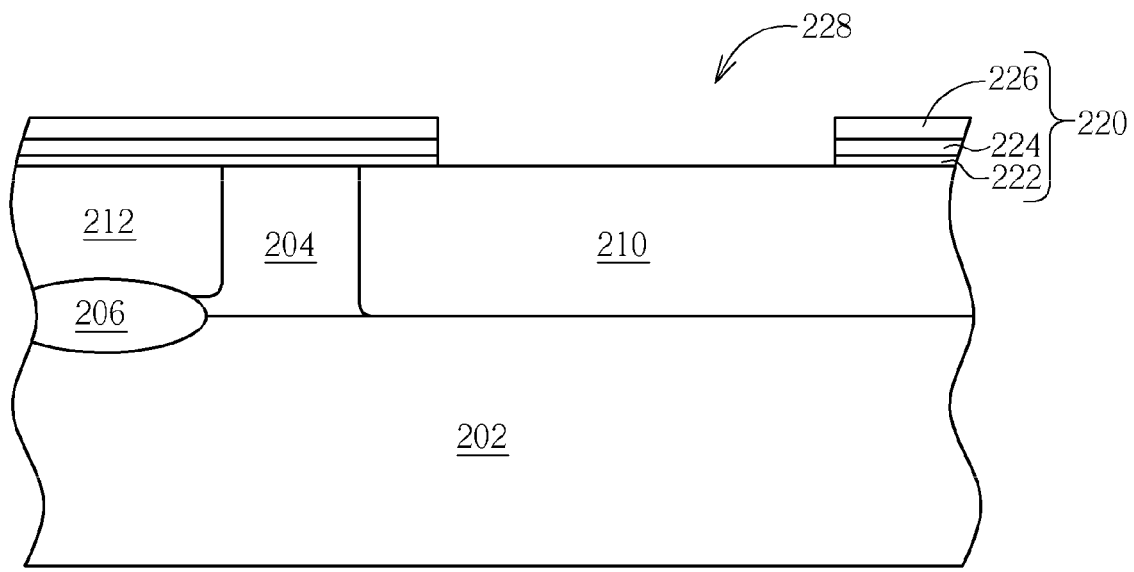

Please refer to FIG. 3, dopants of the first and the second conductive types are respectively implanted to form an N-type well 210 and a P-type well 212 in the P-type substrate 202. As shown in FIG. 3, the P-type heavily doped region 206 is formed between the P-type well 212 and the P-type substrate 202 or between the P-type well 212 and the N-type epitaxial layer 204. It is noteworthy that a dope concentration of the P-type heavily doped region 206 is larger than a dope concentration of the P-type well 212. Then, an oxide-nitride-oxide (ONO) multilayer 220 is formed on the P-type substrate 202. The ONO multilayer 220 sequentially includes a pad oxide layer 222, a nitride layer 224 and an oxide layer 226. Next, the ONO multilayer 220 is patterned to form an opening 228.

Figure 4:
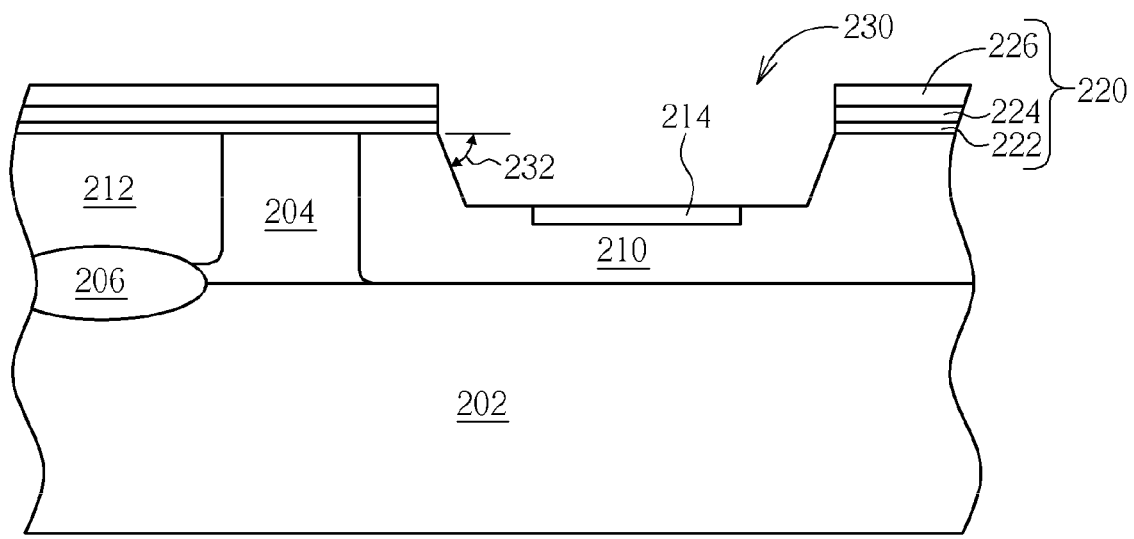

Please refer to FIG. 4. The patterned ONO multilayer 220 is used to be a mask in an etching process that is performed to etch the P-type substrate 202 through the opening 228. Accordingly, a first recess 230 is formed in the P-type substrate 202 in the N-type well 210. A depth of the first recess 230 is of 1-4 micrometer (µm). It is noteworthy that a sidewall of the first recess 230 and a surface of the P-type substrate 202 have an included angle 232, and the included angle 232 is between 30 and 60 degrees. Then, another ion implantation is performed to form a P-type doped region 214 surrounded by the N-type well 210 in the P-type substrate 202 under a bottom of the first recess 230.

Figure 5:
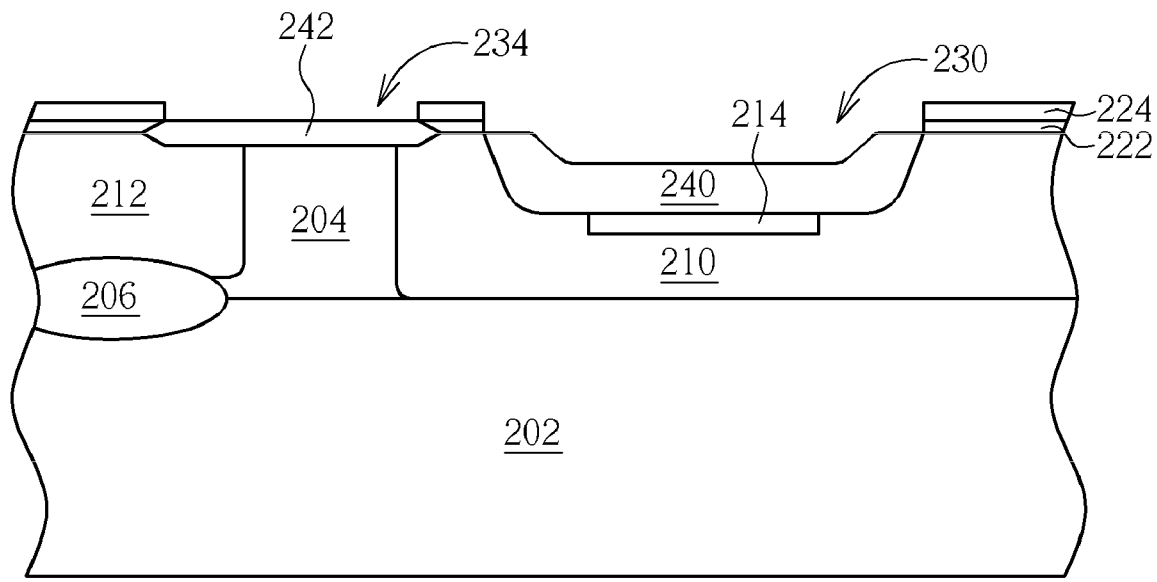

Please refer to FIG. 5. After removing the oxide layer 226, the ONO multilayer 220 is patterned again to form another opening 234, which is used to define an active area. Additionally, the P-type doped region 214 can be formed after the active area is defined through the opening 234. Then, a LOCOS method is performed to form a first insulating layer 240 in the first recess 230. In the mean time, a second insulating layer 242 is formed in the active area through the opening 234. Because the silicon oxide formed in the LOCOS method is to vertically and horizontally consume silicon of the P-type substrate 202, corners between sidewalls and bottoms of the first recess 230 is rounded during forming the first insulating layer 240. The corner rounding effect makes the sidewalls and bottoms of the first recess 230 have a smooth profile, therefore the dense electric field at the corners is alleviated.

Figure 6:
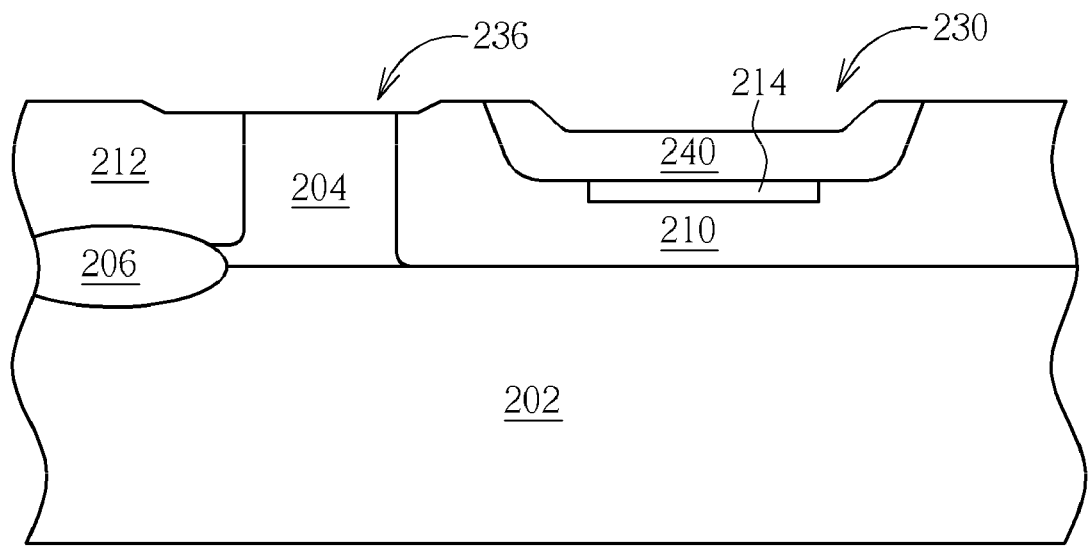

Please refer to FIG. 6. Next, the second insulating layer 242, the nitride layer 224 and the pad oxide layer 222 of the ONO multilayer 220 are removed. As mentioned above, since silicon of the P-type substrate 202 is vertically and horizontally consumed during forming the second insulating layer 242 by LOCOS method, a second recess 236 is formed in the P-type substrate 202 after removing the second insulating layer 242, as shown in FIG. 6.

Figure 7:
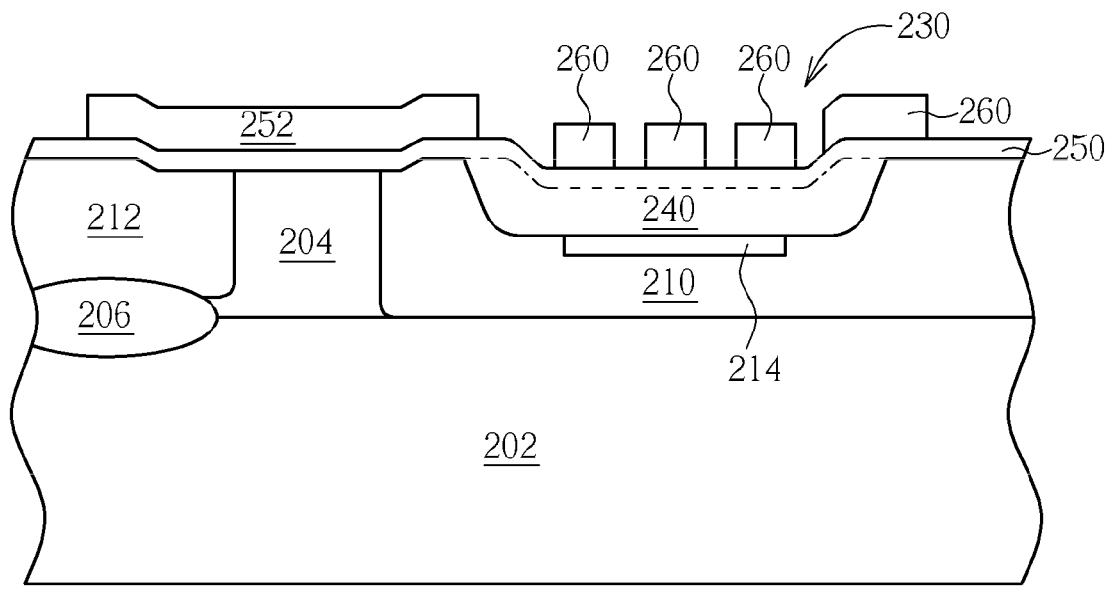

Please refer to FIG. 7. A gate dielectric layer 250 is formed on the P-type substrate 202. In this preferred embodiment, the gate dielectric layer 250 comprises material the same with the first insulating layer 240, therefore an interface between the gate dielectric layer 250 and the first insulating layer 240 is depicted by a dotted line, as shown FIG. 7. However, it is not limited that the gate dielectric layer 250 can comprise other material. Then, a gate 252 is formed on the gate dielectric layer 250. As shown in FIG. 7, the gate 252 is formed extending to cover a portion of the first insulating layer 240. It is noteworthy that a plurality of field plates 260 is formed simultaneously with the formation of the gate 250. The field plates 260 are used to smooth the distribution of the electrical field and thus to increase the breakdown voltage of the ultra high voltage MOS transistor device 200. Furthermore, it is well-known that the distribution of the electrical field is denser at interface between the P-type doped region 214 and the N-type well 240, therefore the field plates 260 are preferably formed above the interface between the P-type doped region 214 and the N-type well 210. Additionally, though the field plates 260 are formed as a floating structure in the preferred embodiment, it is not limited to form the field plates 260 electrically connected to the gate from which a voltage is obtained. And those skilled in the art would easily realize that the critical dimension of the field plates 260, the interval between each field plates 260, and the quantities of the field plates 260 may be modified as required.

Figure 8:
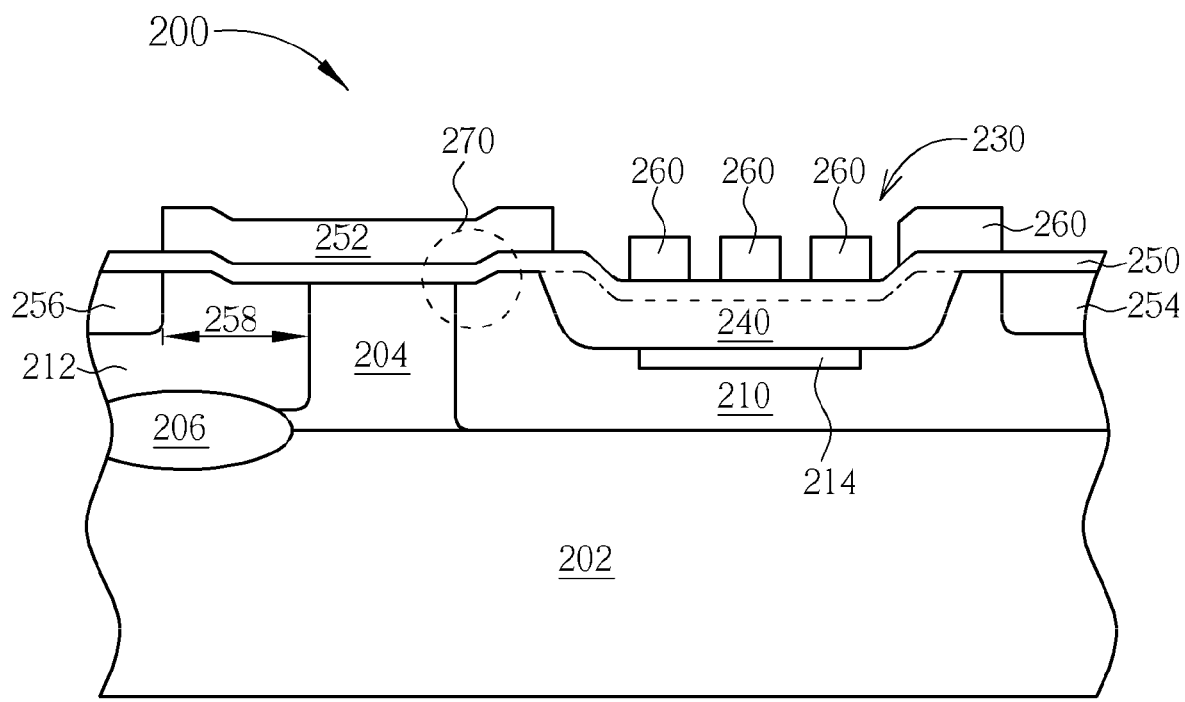

Please refer to FIG. 8. An ion implantation is performed to form a drain region 254 and a source region 256 respectively in the N-type well 210 and the P-type well 212. And another ion implantation is performed to form a P-type contact region (not shown) next to the source region 256. Consequently, an ultra high voltage MOS transistor device 200 is obtained.

Please still refer to FIG. 8. the ultra high voltage MOS transistor device 200 provided by the preferred embodiment includes a P-type substrate 202 and an N-type epitaxial layer 204 formed thereon. An N-type well 210 and a P-type well 212 are respectively formed in the epitaxial layer 204. The source region 256 is formed in the P-type well 212 and the drain region 254 is formed in the N-type well 210. The first recess 230 is formed in the P-type substrate 202 in the N-type well 210 with the first insulating layer 240 formed therein. The P-type doped region 214 is formed in the N-type well 210 under the first insulating layer 240 and adjacent to the first insulating layer 240. The ultra high voltage MOS transistor device 200 also includes the gate 252 positioned on the P-type substrate 202 between the first insulating layer 240 and the source region 212. The gate 252 is formed extending to cover a portion of the first insulating layer 240. Additionally, the plurality of field plates 260 simultaneously formed with the gate 252 is provided on the first insulating layer 240.

In the preferred embodiment, the P-type heavily doped region 206 is formed between the P-type well 212 and the N-type epitaxial layer 204 or between the P-type well 212 and P-type substrate 202 to change the P-N junction between the source region 256 with N-type, the P-type well 212, the N-type epitaxial layer 204, and the P-type substrate 202. Therefore the parasite BJT effect and the snap-back phenomenon are prevented. Accordingly, the ultra high voltage MOS transistor device 200 is prevented from failure under high operational voltage environment.

Secondly, in the preferred embodiment, the first insulating layer 240 is formed in the first recess 230 having a depth of 1-4 µm, and the P-type doped region 214 is formed in the N-type well 210 under a bottom of the first recess 230, therefore the fully-depleted region is easily formed even the dope concentration of the N-type well 210 is increased to reduce the $R_{ON}$. Accordingly the breakdown voltage is increased. Furthermore, the sidewall of the first recess 230 and the surface of the P-type substrate 202 have the included angle between 30 and 60 degrees. This design and the feature that silicon of the substrate is consumed in LOCOS make the corners between the first insulating layer 240 and the N-type well 210 are rounded, thus the dense electric field at the corners alleviated.

As mentioned above, the recessed channel region 258 and a recessed interface 270 proximate to the source region 256 are formed by employing the feature that silicon of the P-type substrate 202 is vertically and horizontally consumed in LOCOS. The recessed channel region 258 and the recessed interface 270 are provided to adjust the distribution of the potential lines, and thus curvature of the potential lines in the recessed channel region 258 is made smaller. Accordingly, the breakdown voltage is increased.

According to the ultra high voltage MOS transistor device provided by the present invention, the recessed channel region is provided to alleviate the large curvature problem of the potential line occurred at the channel region, the first doped region is provided to prevent the parasite BJT effect from being occurred between the second well and the substrate, and the first recess with larger depth in the first well is provided to improve the formation of the fully-depleted region, therefore the breakdown voltage is increased without increasing the $R_{ON}$. Simply speaking, the present invention provides an ultra high voltage LDMOS transistor device with high breakdown voltage, low $R_{ON}$, and ability to avoid the problems such as the parasite BJT region and the large-curvature potential line at the channel region under high operational voltage environment Those skilled in the art will readily observe that numerous modifications and alterations of the device and method may be made while retaining the teachings of the invention.

What is claimed is:

1. An ultra high voltage metal-oxide-semiconductor (MOS) transistor device, comprising:
    a substrate having a first conductive type;
    a first well having a second conductive type formed in the substrate;
    a drain region having the second conductive type formed in the first well;
    a source region having the second conductive type formed in the substrate;
    an insulating layer formed on a surface of the first well;
    a first recess formed in the substrate, the insulating layer being formed in the first recess;
    a second recess formed in the substrate in the first well, wherein the first recess is formed in the substrate between the source region and the second recess;
    a gate positioned in the first recess and extending to cover a portion of the insulating layer; and
    a recessed channel region formed in the substrate under the gate and under a bottom of the first recess.

2. The ultra high voltage MOS transistor device of claim 1 further comprising:
    a second well having the first conductive type surrounding the source region in the substrate; and
    a first doped region having the first conductive type.

3. The ultra high voltage MOS transistor device of claim 2, wherein a dope concentration of the first doped region is larger than a dope concentration of the second well.

4. The ultra high voltage MOS transistor device of claim 2 further comprising an epitaxial layer with the second conductive type and having the first well and the second well formed therein.

5. The ultra high voltage MOS transistor device of claim 4, wherein the first doped region is formed between the second well and the substrate or between the second well and the epitaxial layer.

6. The ultra high voltage MOS transistor device of claim 1 further comprising a second doped region having the first conductive type formed in the substrate under a bottom of the second recess and adjacent to the insulating layer.

7. The ultra high voltage MOS transistor device of claim 1 further comprising a plurality of field plates positioned on the insulating layer.

8. An ultra-high voltage MOS transistor device comprising:
    a substrate having a first conductive type;
    an epitaxial layer having a second conductive type formed on the substrate;
    a first well having the second conductive type formed in the epitaxial layer;
    a drain region having the second conductive type formed in the first well;
    a second well having the first conductive type formed in the epitaxial layer;
    a source region having the second conductive type formed in the second well;
    a first recess formed in the substrate in the first well;
    an insulating layer formed in the first recess;
    a second recess formed in the substrate between the source region and the first recess;
    a recessed channel region formed in the substrate under a bottom of the second recess;
    a first doped region having the first conductive type formed in a bottom of the second well and not contacting the source region; and
    a gate positioned on the substrate between the source region and the first well.

9. The ultra high voltage MOS transistor device of claim 8, wherein a dope concentration of the first doped region is larger than a dope concentration of the second well.

10. The ultra high voltage MOS transistor device of claim 8, wherein the first doped region is formed between the second well and the substrate.

11. The ultra high voltage MOS transistor device of claim 8, wherein the first doped region is formed between the second well and the epitaxial layer.

12. The ultra high voltage MOS transistor device of claim 8 further comprising a second doped region having the first conductive type formed in the substrate under a bottom of the first recess and adjacent to the insulating layer.

13. The ultra high voltage MOS transistor device of claim 8 further comprising a plurality of field plates positioned on the insulating layer.

* * * * *